United States Patent
Abedijaberi et al.

(10) Patent No.: US 10,344,380 B2
(45) Date of Patent: Jul. 9, 2019

(54) LINER ASSEMBLIES FOR SUBSTRATE PROCESSING SYSTEMS

(71) Applicant: SunEdison, Inc., St. Peters, MO (US)

(72) Inventors: Arash Abedijaberi, St. Peters, MO (US); Shawn George Thomas, Chesterfield, MO (US)

(73) Assignee: GlobalWafers Co., Ltd., Hsinchu (TW)

( * ) Notice: Subject to any disclaimer, the term of this patent is extended or adjusted under 35 U.S.C. 154(b) by 477 days.

(21) Appl. No.: 14/176,263

(22) Filed: Feb. 10, 2014

(65) Prior Publication Data
US 2014/0224174 A1    Aug. 14, 2014

Related U.S. Application Data

(60) Provisional application No. 61/763,280, filed on Feb. 11, 2013.

(51) Int. Cl.
| | |
|---|---|
| *C23C 16/00* | (2006.01) |
| *C23C 16/455* | (2006.01) |
| *H01L 21/00* | (2006.01) |

(52) U.S. Cl.
CPC .. *C23C 16/45504* (2013.01); *C23C 16/45563* (2013.01)

(58) Field of Classification Search
CPC ............ C23C 16/45504; C23C 16/45563
USPC ........................................... 156/916
See application file for complete search history.

(56) References Cited

U.S. PATENT DOCUMENTS

| | | | | |
|---|---|---|---|---|
| 5,834,059 | A * | 11/1998 | Anderson | C23C 16/455 427/248.1 |
| 5,916,369 | A * | 6/1999 | Anderson | C23C 16/455 118/715 |
| 6,238,738 | B1 * | 5/2001 | McCurdy | C03C 17/2453 427/166 |
| 6,245,149 | B1 * | 6/2001 | de Lomenie | C23C 16/4405 118/715 |
| 6,500,734 | B2 * | 12/2002 | Anderson | C23C 16/45504 438/478 |
| 8,888,087 | B2 * | 11/2014 | Okabe | H01L 21/02617 269/289 R |
| 8,926,753 | B2 * | 1/2015 | Yamada | C23C 16/455 117/200 |

(Continued)

FOREIGN PATENT DOCUMENTS

| | | |
|---|---|---|
| EP | 1703550 A1 | 9/2006 |
| JP | 2002231641 A | 8/2002 |

(Continued)

*Primary Examiner* — Sylvia MacArthur
*Assistant Examiner* — Michelle Crowell
(74) *Attorney, Agent, or Firm* — Armstrong Teasdale LLP

(57) ABSTRACT

A liner assembly for a substrate processing system includes a first liner and a second liner. The first liner includes an annular body and an outer peripheral surface including a first fluid guide. The first fluid guide is curved about a circumferential line extending around the first liner. The second liner includes an annular body, an outer rim, an inner rim, a second fluid guide extending between the outer rim and the inner rim, and a plurality of partition walls extending outwardly from the second fluid guide. The second fluid guide is curved about the circumferential line when the first and second liners are positioned within the processing system.

24 Claims, 10 Drawing Sheets

(56) References Cited

U.S. PATENT DOCUMENTS

| | | | |
|---|---|---|---|
| 2007/0051312 A1* | 3/2007 | Sneh | C23C 14/566 |
| | | | 118/719 |
| 2007/0269983 A1* | 11/2007 | Sneh | C23C 16/4409 |
| | | | 438/689 |
| 2007/0281084 A1* | 12/2007 | Hirosawa | C23C 16/45565 |
| | | | 427/248.1 |
| 2009/0110826 A1* | 4/2009 | Aggarwal | C23C 16/4412 |
| | | | 427/255.28 |
| 2011/0198417 A1* | 8/2011 | Detmar | H01J 37/321 |
| | | | 239/569 |
| 2012/0240853 A1 | 9/2012 | Carlson et al. | |
| 2014/0273503 A1* | 9/2014 | Pitney | C23C 16/45563 |
| | | | 438/758 |

FOREIGN PATENT DOCUMENTS

| | | | | |
|---|---|---|---|---|
| JP | 2003086524 A | | 3/2003 | |
| JP | 2003142400 A | * | 5/2003 | H01L 21/6715 |
| WO | 2012128783 A1 | | 9/2012 | |

\* cited by examiner

LINER ASSEMBLIES FOR SUBSTRATE PROCESSING SYSTEMS

CROSS-REFERENCE TO RELATED APPLICATIONS

This application claims priority to U.S. Provisional Application Ser. No. 61/763,280, filed on Feb. 11, 2013, which is hereby incorporated by reference in its entirety.

FIELD

The field relates generally to the use of chemical vapor deposition systems in processing semiconductor wafers and, more specifically, to liner assemblies for use in chemical vapor deposition chambers.

BACKGROUND

In chemical vapor deposition (CVD) processes, including epitaxial growth processes, uniformity in the thickness of a deposited film on a substrate is dependent on, among other factors, uniformity in the flow distribution of gasses within the process chamber. As the requirements for uniformity in film thickness become more stringent, the desire for more uniform flow rate distribution of gasses in the process chamber increases.

In conventional CVD devices, a source gas is introduced into the process chamber through a set of liners. Conventional liners include an upper fluid guide and a lower fluid guide that guide gas over the top surface of the substrate without disturbing its distribution to the extent possible.

However, the fluid guides of conventional liners are stepped or linearly sloped. In particular, the upper fluid guide is typically stepped and the lower fluid guide is typically stepped or linearly sloped. As a result, the fluid guides disturb the incoming gas flow such that the gas flow rate at certain regions on the substrate surface are significantly higher than others, resulting in uneven growth rates. This results in a non-uniform film thickness. These negative effects are amplified at higher flow rates, which are desirable to increase the throughput of CVD devices.

The fluid guides of conventional liners can also disturb the incoming gas flow such that little gas flows over certain regions of the substrate surface, resulting in "dead spots" on the substrate surface.

Additionally, because stepped and linearly sloped fluid guides of conventional liners disturb the incoming gas flow, the flow rate distribution across the substrate surface is highly dependent upon the incoming gas flow rate and gas type. As a result, when the gas flow rate or gas type is changed, the CVD device must be tuned by varying one or more parameters of the CVD reactor to account for changes in the flow rate distribution across the substrate surface.

A need exists for a liner assembly capable of delivering a more uniform flow rate distribution across the surface of a substrate.

This Background section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

BRIEF SUMMARY

In one aspect, a liner assembly for a substrate processing system is provided. The liner assembly includes a first liner and a second liner. The first liner includes an annular body and an outer peripheral surface including a first fluid guide. The first fluid guide is curved about a circumferential line extending around the first liner. The second liner includes an annular body, an outer rim, an inner rim, a second fluid guide extending between the outer rim and the inner rim, and a plurality of partition walls extending outwardly from the second fluid guide. The second fluid guide is curved about the circumferential line when the first and second liners are positioned within the processing system.

In another aspect, a liner assembly for a substrate processing system is provided. The liner assembly includes a first liner and a second liner. The first liner includes a first fluid guide having a concave portion and a convex portion. The second liner includes a second fluid guide having a concave portion and a convex portion. The first and second liners are configured to engage one another such that the first and second fluid guides form at least one fluid guiding channel.

In yet another aspect, a chemical vapor deposition system for processing a substrate is provided. The system includes a processing chamber, a first liner, and a second liner. The processing chamber has a processing volume enclosed therein, and includes a lower chamber wall and an upper chamber wall. The first liner is disposed between the lower chamber wall and the processing volume, and includes a first fluid guide that is curved about a circumferential line extending around the first liner. The second liner is disposed between the upper chamber wall and the processing volume, and includes an outer rim, an inner rim, and a second fluid guide extending between the outer rim and the inner rim. The second fluid guide is curved about the circumferential line.

Various refinements exist of the features noted in relation to the above-mentioned aspects. Further features may also be incorporated in the above-mentioned aspects as well. These refinements and additional features may exist individually or in any combination. For instance, various features discussed below in relation to any of the illustrated embodiments may be incorporated into any of the above-described aspects, alone or in any combination.

BRIEF DESCRIPTION OF THE DRAWINGS

Like reference symbols used in the various drawings indicate like elements.

DETAILED DESCRIPTION

Figure 1:
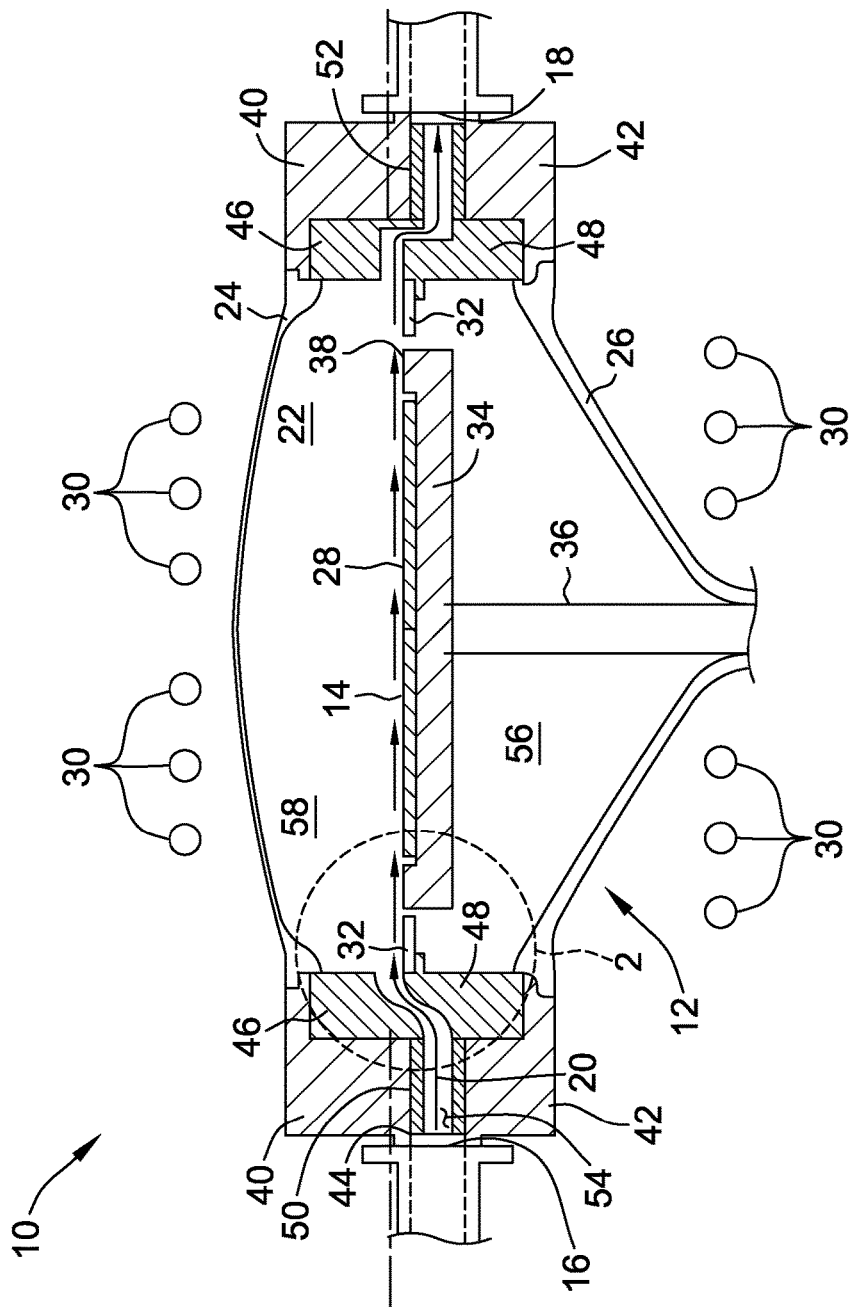
FIG. 1 is a cross-section of a chemical vapor deposition system including a liner assembly of one embodiment.

A chemical vapor deposition (CVD) system is indicated generally at 10 in FIG. 1. The CVD system 10 includes a processing chamber 12 for depositing and/or growing thin films on a substrate 14 (e.g., a semiconductor wafer), a gas injecting port 16 disposed at one end of the processing chamber 12, and a gas discharge port 18 disposed at an opposite end of the processing chamber 12. In operation, a gas 20 is introduced into a processing volume 22 enclosed by an upper window 24 and a lower window 26 through the gas injecting port 16. The gas 20 flows over the substrate surface 28 and reacts with the substrate surface 28, or precursors disposed thereon, to deposit a film on the substrate surface 28. The gas 20 then flows out of the processing volume 22 through the gas discharge port 18. The CVD system also includes heating elements 30 (e.g., infrared heating lamps) for heating the substrate, and a preheating ring 32 for confining gas 20 to an upper portion 58 of the processing volume.

The substrate 14 upon which the film is deposited is supported by a susceptor 34 within the processing volume 22. The susceptor 34 is connected to a motorized shaft 36, which rotates the susceptor 34 (thereby rotating the substrate 14) during the CVD process. The outer rim 38 of the susceptor is substantially flush with the substrate surface 28 when the substrate 14 is placed on the susceptor 34.

The upper and lower windows 24, 26 each comprise a generally annular body made of quartz. The windows 24, 26 may be planar, or, as shown in FIG. 1, the windows 24, 26 may have a generally dome-shaped configuration. Alternatively, one or both of the windows 24, 26 may have an inwardly concave configuration. The upper and lower window 24, 26 are coupled to the upper and lower chamber walls 40, 42 of the processing chamber 12, respectively.

The upper and lower chamber walls 40, 42 define the outer perimeter of the processing chamber 12, and abut the gas injecting port 16 and the gas discharge port 18. In some embodiments, the gas injecting port 16 may be divided into two or more inject zones by one or more dividing walls (not shown) disposed within the gas injecting port 16 and extending in the direction of gas flow. Flow controllers, such as mass flow controllers, (not shown) in fluid communication with the inject zones are used to adjust the gas flow rate in the different inject zones. The flow controllers may be operated independently of one another, thereby permitting different gas flow rates in the different inject zones.

A baffle plate 44 is disposed between the upper and lower chamber walls 40, 42 where the gas injecting port 16 abuts the chamber walls 40, 42. The baffle plate 44 has a generally elongate planer shape, and has a plurality of holes formed therein and distributed along the length of the body of baffle plate 44 to permit passage of gas 20 therethrough.

To prevent reactions between the gas 20 and the chamber walls 40, 42 (which are typically fabricated from metallic materials, such as stainless steel), a plurality of liners 46, 48 and inserts 50, 52 are disposed within the processing chamber 12. The liners 46, 48 and inserts 50, 52 are fabricated from suitable material such as quartz, or more specifically fused quartz manufactured from high-purity silica powder. The quartz suitably does not react with the gas 20.

An inject insert 50 is disposed between the upper and lower chamber walls 40, 42, adjacent to the baffle plate 44 and the upper and lower liners 46, 48. The inject insert 50 defines a passageway 54 for the gas 20 from the gas injecting port 16 to a channel 140 (FIG. 2) defined by the upper and lower liners 46, 48. In some embodiments, the inject insert 50 may be divided into two or more inject insert zones by one or more dividing walls (not shown) disposed within the inject insert 50 and extending the length of the inject insert 50 in a direction perpendicular to the baffle plate 44.

Figure 4:
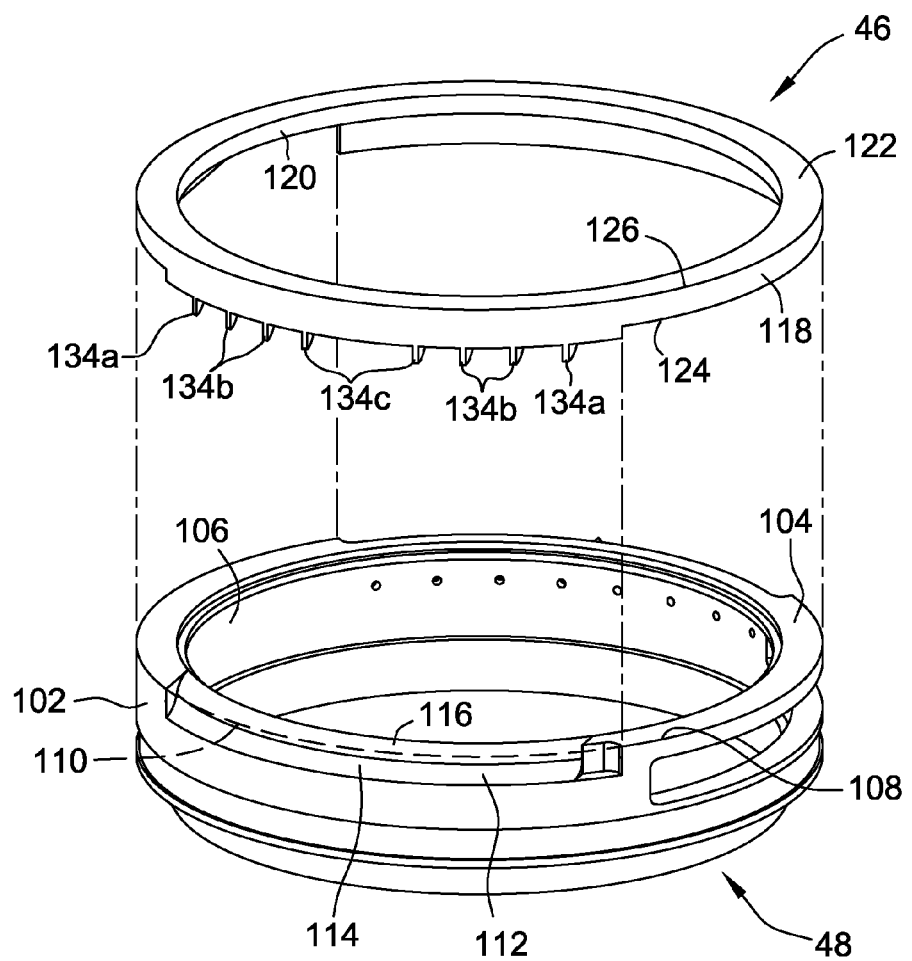
FIG. 4 is an exploded perspective view of the liner assembly of FIG. 1, including an upper liner and a lower liner.
Figure 5:
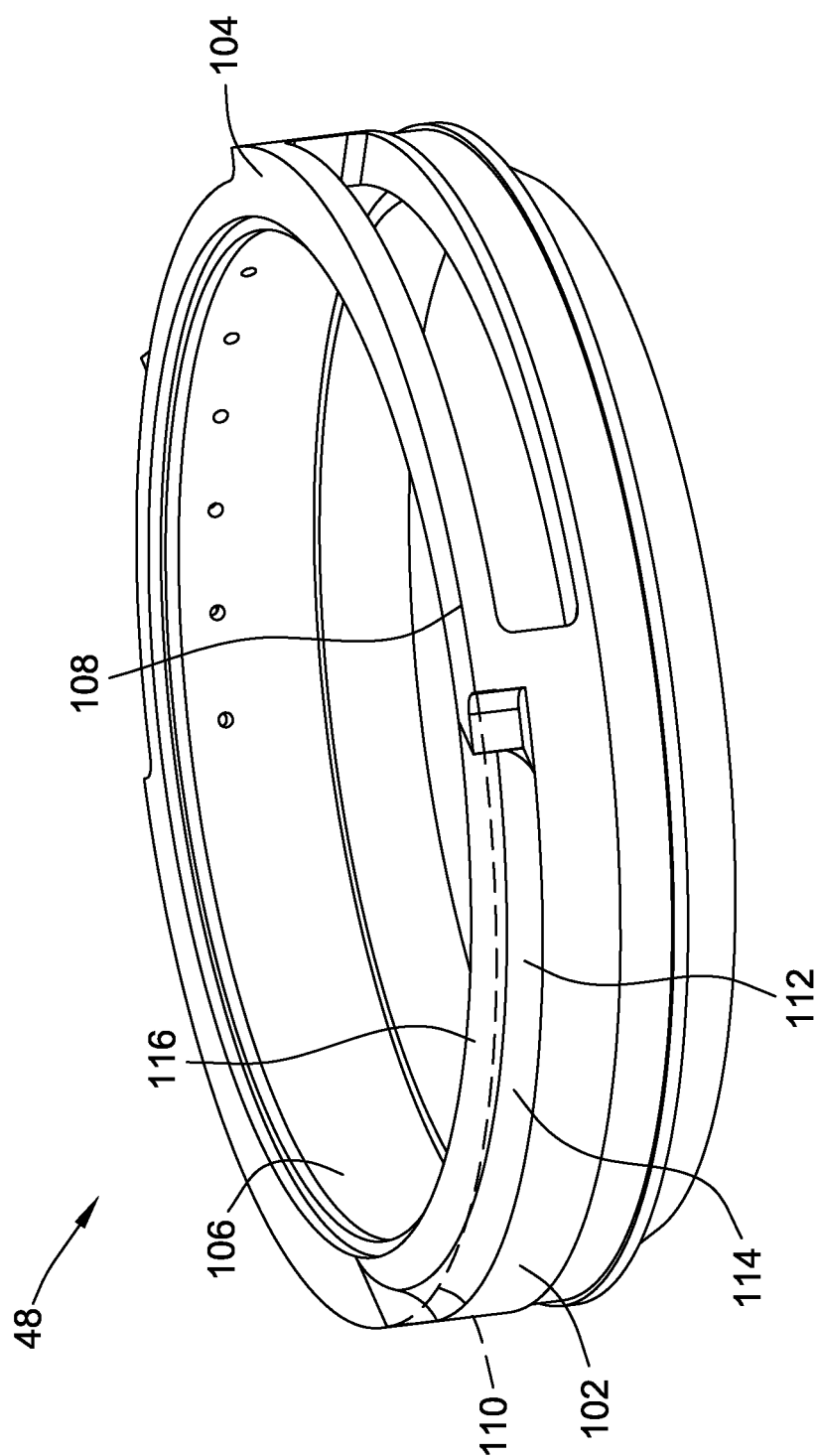
FIG. 5 is a perspective of the lower liner of FIG. 4.
Figure 6:
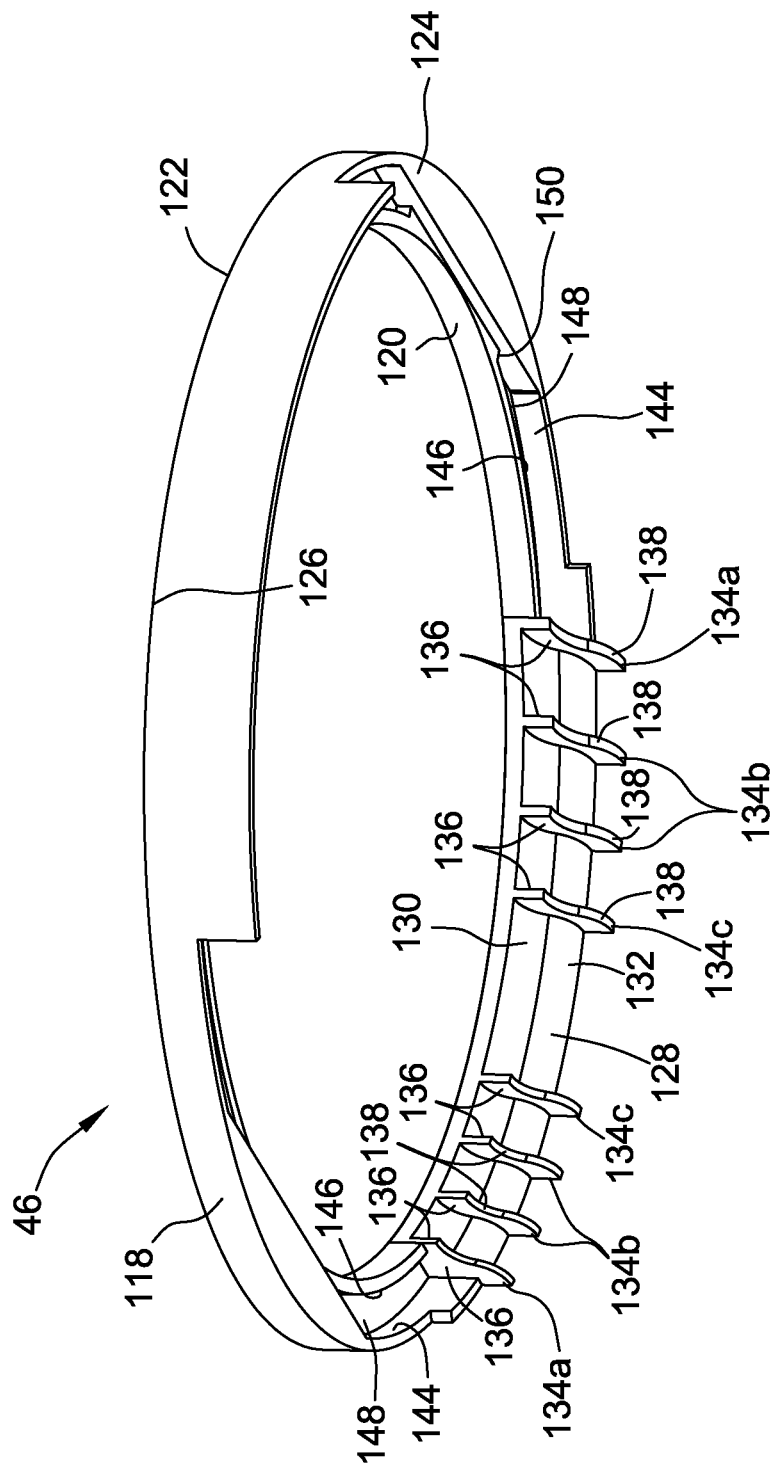
FIG. 6 is a perspective of the upper liner of FIG. 4.

As shown in FIGS. 4-6, the upper liner 46 and the lower liner 48 each have an annular body made of suitable material, such as quartz or fused quartz manufactured from high-purity silica powder. The lower liner 48 is disposed in a lower portion 56 of the processing volume 22 adjacent the lower chamber walls 42. The upper liner 46 is at least partially disposed in an upper portion 58 of the processing volume 22 adjacent the upper chamber walls 40. The upper and lower liners 46, 48, collectively referred to herein as a liner assembly, act as liners between the chamber walls 40, 42 and the processing volume 22 (FIG. 1) to prevent reactions between the gas 20 and the chamber walls 40, 42.

The lower liner 48 (also referred to herein as a first liner) includes an outer peripheral surface 102, an upper surface 104, and an inner peripheral surface 106. The upper surface 104 includes an outer peripheral edge 108 (also referred to herein as a circumferential edge) that extends around a portion of the outer peripheral surface 102, and defines an imaginary outer peripheral line 110 (also referred to herein as a circumferential line) as shown in FIGS. 2-5. The upper surface 104 of the lower liner 48 engages a lower surface 124 of the upper liner 46 when disposed within the processing chamber 12.

Figure 3:
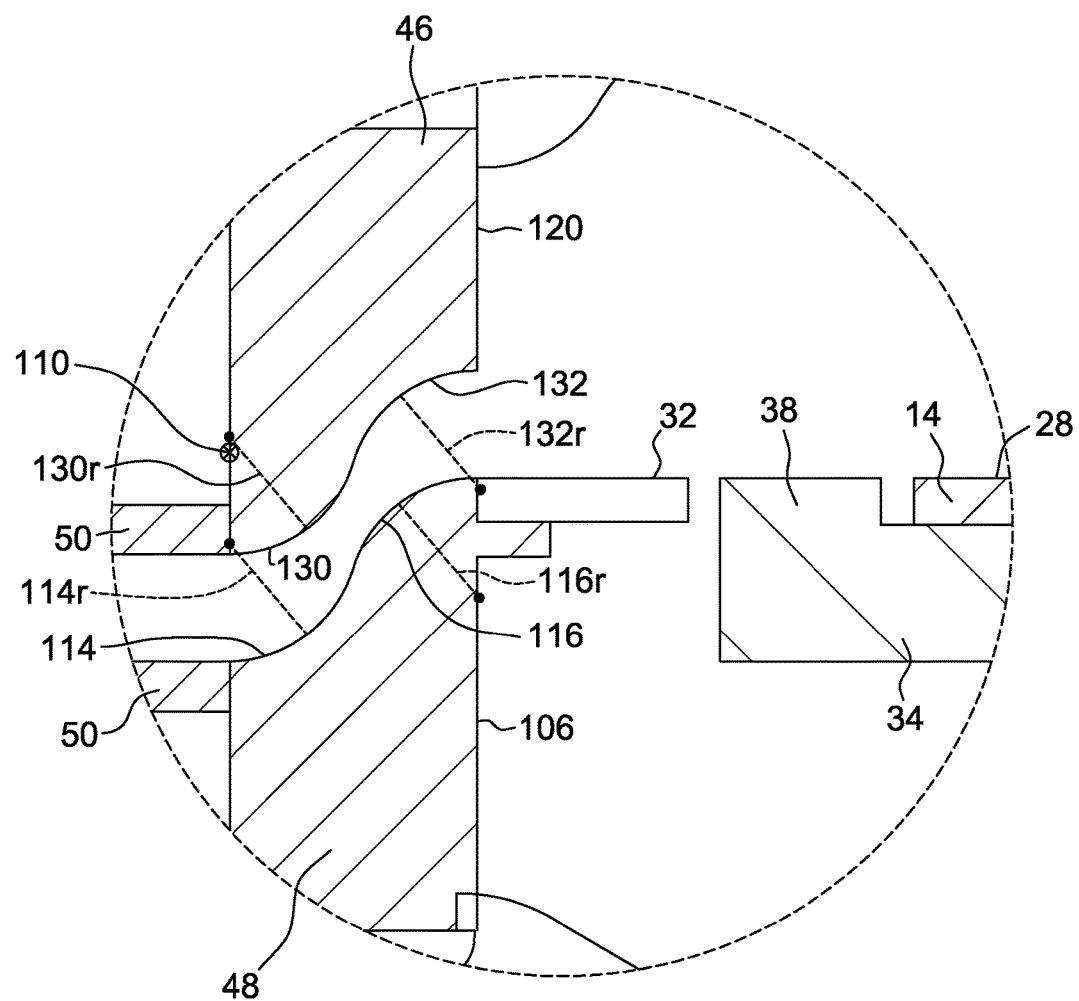
FIG. 3 is another enlarged view of a portion of the liner assembly of FIG. 1.

The outer peripheral surface 102 includes a curved lower fluid guide 112 (also referred to herein as a first fluid guide) for directing incoming gas 20 from the inject insert passageway 54 to the processing volume 22. The fluid guide 112 includes a first portion 114 and a second portion 116. The first portion 114 is concave about the imaginary outer peripheral line 110 of the lower liner 48, and the second portion 116 is convex about the imaginary outer peripheral line 110. Each portion 114, 116 of fluid guide 112 has a corresponding radius of curvature 114$r$, 116$r$ The radius of curvature 114$r$ is selected such that the surface of the lower fluid guide 112 is substantially flush with the inject insert 50 where the lower liner 48 abuts the inject insert 50, as shown in FIG. 3. The radius of curvature 116$r$ is selected such that the surface of the lower fluid guide 112 is substantially flush with the preheating ring 32 where the lower liner 48 abuts the preheating ring 32, as shown in FIG. 3.

In the embodiment shown in FIG. 3, the radiuses of curvature 114$r$, 116$r$ are selected such that the first portion 114 and the second portion 116 are adjoining (i.e., directly connected to one another). As a result, the lower fluid guide 112 is a continuously curved surface. In other embodiments, the radiuses of curvature 114$r$, 116$r$ may be selected so that the first portion 114 and second portion 116 are connected by a linearly sloped portion disposed between the first portion 114 and second portion 116.

In the embodiment shown in FIG. 3, the radius of curvature 114$r$ is equal to the radius of curvature 116$r$. In other embodiments, the radius of curvature 114$r$ may be greater than, or less than, the radius of curvature 116$r$.

In the illustrated embodiment, the radiuses of curvature 114$r$, 116$r$ are between 5 millimeters and 27 millimeters, more specifically between 10 millimeters and 20 millimeters, and, more specifically, the radiuses of curvature 114$r$, 116$r$ are both 15.7 millimeters.

Figure 2:
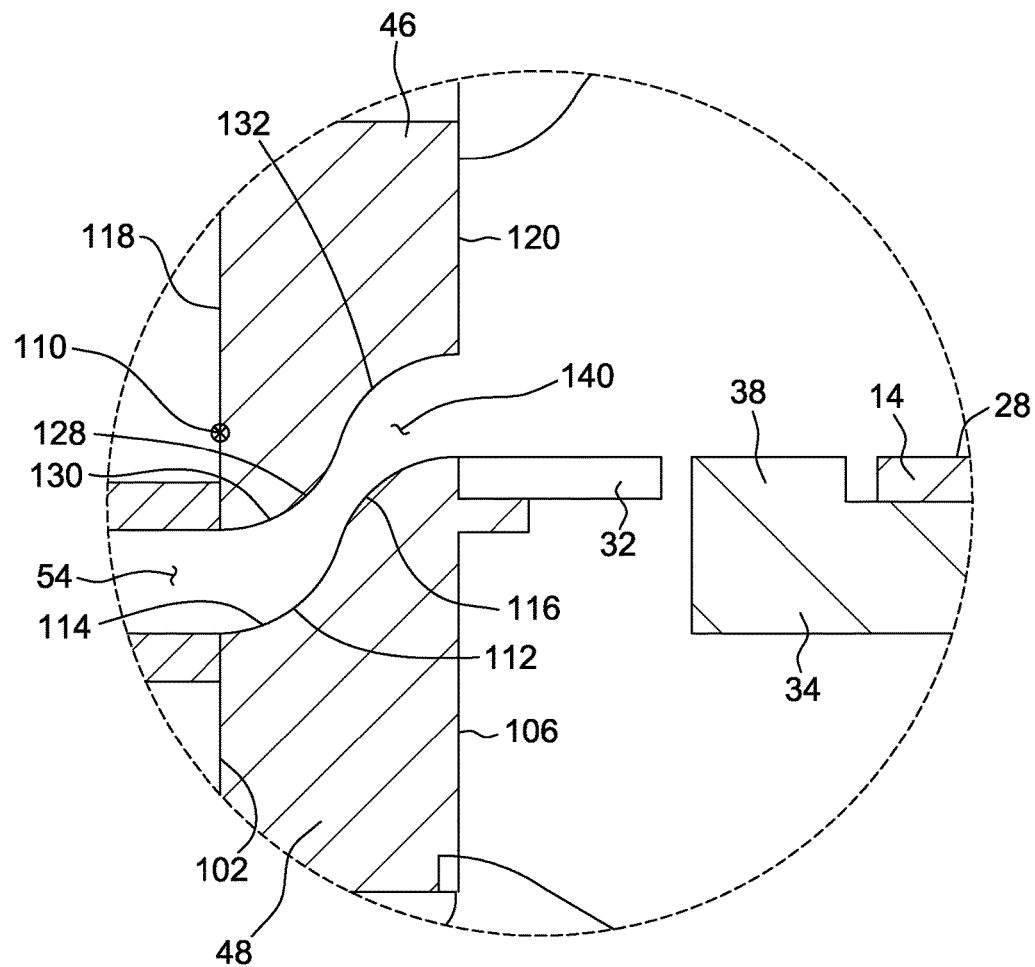
FIG. 2 is an enlarged view of a portion of the liner assembly of FIG. 1.

The upper liner 46 (also referred to herein as a second liner) includes an outer rim 118, an inner rim 120, a top 122 and a lower surface 124 that engages the upper surface 104 of the lower liner 48 when disposed within the processing chamber 12. The upper liner 46 also includes an outer peripheral edge 126 adjoining the outer rim 118 and top 122, and extending around the perimeter of the outer rim 118. The upper liner 46 also includes a curved upper fluid guide 128 (also referred to herein as a second fluid guide) extending between the outer rim 118 and the inner rim 120. The upper fluid guide 128 is contoured to complement the lower fluid guide 112 (i.e., the upper fluid guide 128 has a shape complementary to the lower fluid guide 112). The upper fluid guide 128 includes a first portion 130 that is concave about the outer peripheral edge 126, and a second portion 132 that is convex about the outer peripheral edge 126. When the liners 46, 48 are positioned within the processing chamber 12, the first portion 130 of the upper fluid guide 128 is concave about the imaginary outer peripheral line 110 of the lower liner 48, and the second portion 132 of the upper fluid guide 128 is convex about the imaginary outer peripheral line 110, as shown in FIG. 2. Each portion 130, 132 of fluid guide 128 has a corresponding radius of curvature 130$r$, 132$r$.

The radiuses of curvature 130$r$, 132$r$ are selected such that upper fluid guide 128 complements the lower fluid guide 112, as shown in FIG. 3.

The radius of curvature 130$r$ is selected such that the surface of the upper fluid guide 128 is substantially flush with the inject insert 50 where the upper liner 46 abuts the inject insert 50, as shown in FIG. 3. The radius of curvature 132$r$ is selected such that the surface of the upper fluid guide 128 is substantially perpendicular to the inner rim 120 where the upper fluid guide 128 adjoins the inner rim 120, as shown in FIG. 3.

In the embodiment shown in FIG. 3, the radiuses of curvature 130$r$, 132$r$ are selected such that the first portion 130 and the second portion 132 are adjoining (i.e., directly connected to one another). As a result, the upper fluid guide 128 is a continuously curved surface. In other embodiments, the radiuses of curvature 130$r$, 132$r$ may be selected so that the first portion 130 and second portion 132 are connected by a linearly sloped portion disposed between the first portion 130 and second portion 132.

In the embodiment shown in FIG. 3, the radius of curvature 130$r$ is equal to the radius of curvature 132$r$. In other embodiments, the radius of curvature 130$r$ may be greater than, or less than, the radius of curvature 132$r$.

In the illustrated embodiment, the radiuses of curvature 130$r$, 132$r$ are between 5 millimeters and 27 millimeters, more specifically between 10 millimeters and 20 millimeters, and, more specifically, the radiuses of curvature 130$r$, 132$r$ are both 15.7 millimeters.

Figure 7:
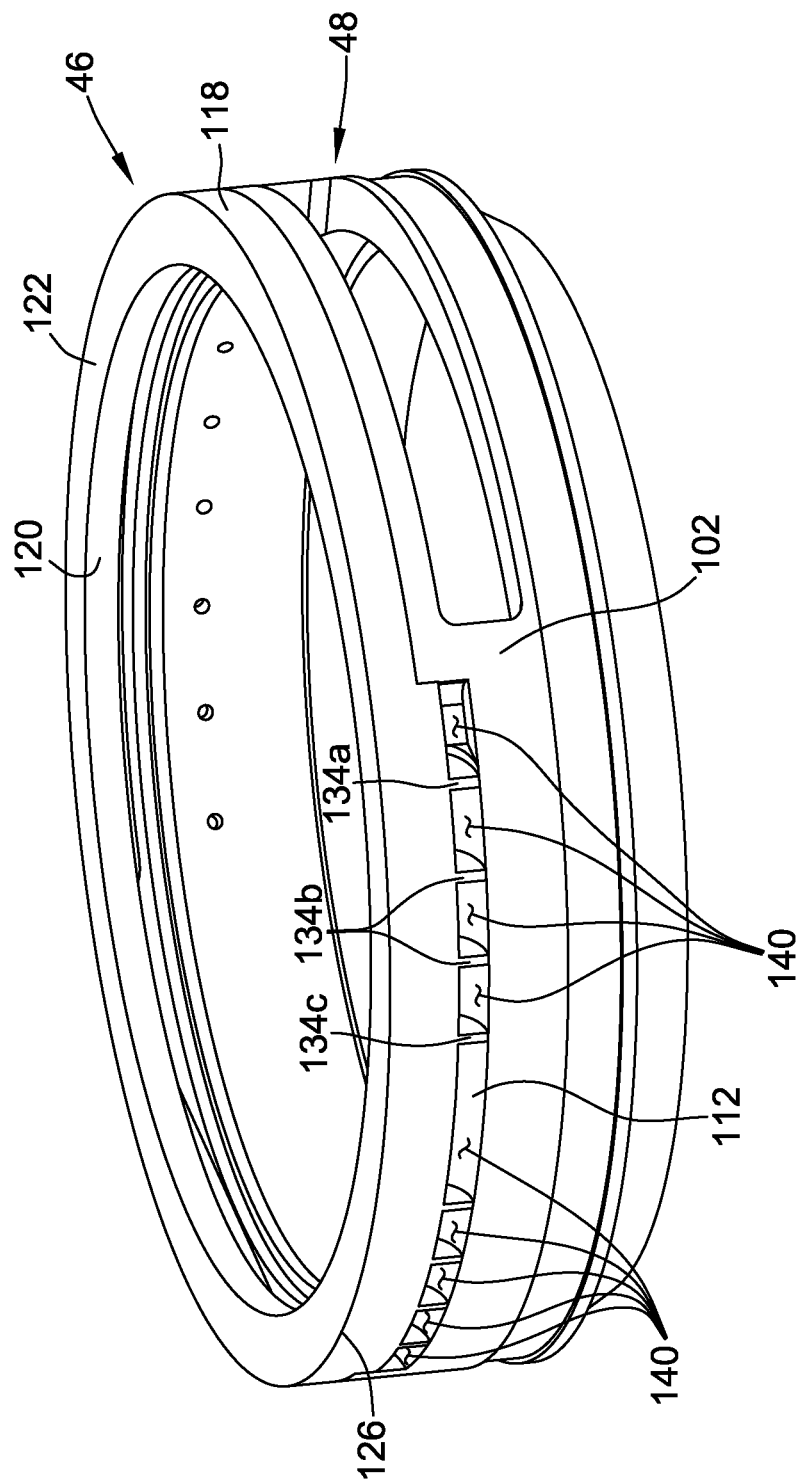
FIG. 7 is a perspective of the assembled liner assembly of FIG. 4.

As shown in FIGS. 6 and 7, the fluid guide 128 of the upper liner 46 includes a plurality of partition walls 134$a$, 134$b$, 134$c$ extending outwardly from the surface of the fluid guide 128. Each partition wall 134$a$, 134$b$, 134$c$ has vertically extending sides 136 and a lower surface 138 extending between the sides 136 of a respective partition wall 134$a$, 134$b$, 134$c$. The lower surface 138 of each partition wall 134$a$, 134$b$, 134$c$ is contoured to match the contours of the lower fluid guide 112 (i.e., the lower surfaces 138 of the partition walls 134$a$, 134$b$, 134$c$ have a shape complementary to the lower fluid guide 112). The embodiment shown in FIGS. 4 and 6 has a total of eight partition walls, including two outer partition walls 134$a$, four inner partition walls 134$b$, and two central partition walls 134$c$, although other embodiments may have at least 3, 4, 5, 6, or 7 partition walls, and up to 10, 12, 14, 16, 18, 20, or 22 partition walls. The partition walls 134$a$, 134$b$, 134$c$ may be evenly distributed or spaced across the fluid guide 128 such that the distance between adjacent partition walls is the same for each pair of adjacent partition walls.

Alternatively, the spacing between partition walls 134$a$, 134$b$, 134$c$ may vary. The partition walls 134$a$, 134$b$, 134$c$ may be unevenly spaced such that the partition walls 134$a$, 134$b$, 134$c$ are aligned with the dividing walls disposed within inject insert 50. In the embodiment shown in FIGS. 4 and 6-9, the outer and inner partition walls 134$a$, 134$b$ are spaced an equal distance apart and the central two partition walls 134$c$ are spaced apart by a distance greater than the outer and inner partition walls 134$a$, 134$b$.

The partition walls 134$a$, 134$b$, 134$c$ extend outwardly from the fluid guide 128 a predetermined distance such that the lower surfaces 138 of the partition walls 134$a$, 134$b$, 134$c$ are substantially flush with the surface of the lower fluid guide 112 when the upper and lower liners 46, 48 are positioned within the processing chamber 12. Thus, when the upper and lower liners 46, 48 are positioned within the processing chamber 12, channels 140 are formed through which the incoming gas 20 flows before entering the processing volume 22.

The channels 140 are defined by the surface of the upper fluid guide 128, the surface of the lower fluid guide 112, and the sides 136 of adjacent partition walls 134$a$, 134$b$, 134$c$. As the incoming gas 20 enters a channel 140, the lower fluid guide 112 provides a smooth, continuous surface between the inject insert 50 and the lower fluid guide 112, and gradually directs the gas 20 upwards towards the upper fluid guide 128. The adjacent partition walls 140 prevent the gas 20 from flowing outwardly in a circumferential direction along the fluid guide 112. As the incoming gas 20 moves further into channel 140, the upper fluid guide 128 gradually redirects upward flowing gas 20 towards processing chamber 12. As the gas 20 flows out of channel 140 and into the processing chamber 12, the lower fluid guide 112 provides a smooth, continuous surface between preheating ring 32 and lower fluid guide 112.

The curved surface of the lower fluid guide 112 provides a smooth, continuous surface over which the incoming gas 20 flows compared to a stepped wall or a linearly sloped wall, which have abrupt changes that tend to disrupt incoming gas flow and create "dead spots" on the substrate surface 28. The upper fluid guide 128 further reduces disruptions in the incoming gas flow by providing an additional contoured surface to direct the incoming gas 20 into the processing chamber 12. The curved fluid guides 128, 112 of the upper and lower liners 46, 48 thereby reduce disruptions in gas flow, and thus provide a more uniform gas flow rate over the substrate surface 28. As a result, the film deposited on the substrate 14 has a more uniform film thickness compared to films grown using liners with stepped or linearly sloped fluid guides. By reducing disruptions in gas flow, the curved fluid guides 128, 112 permit higher gas flow rates to be used within the CVD system, thereby reducing processing time and increasing the throughput of CVD systems.

Additionally, because the curved surfaces of the upper and lower fluid guides 128, 112 reduce disruptions in the incoming gas flow, the dependency of the flow rate distribution on the incoming gas flow rate and gas type is also reduced. As a result, it is not necessary to tune the CVD system every time the incoming gas flow rate or gas type is modified.

Figure 8:
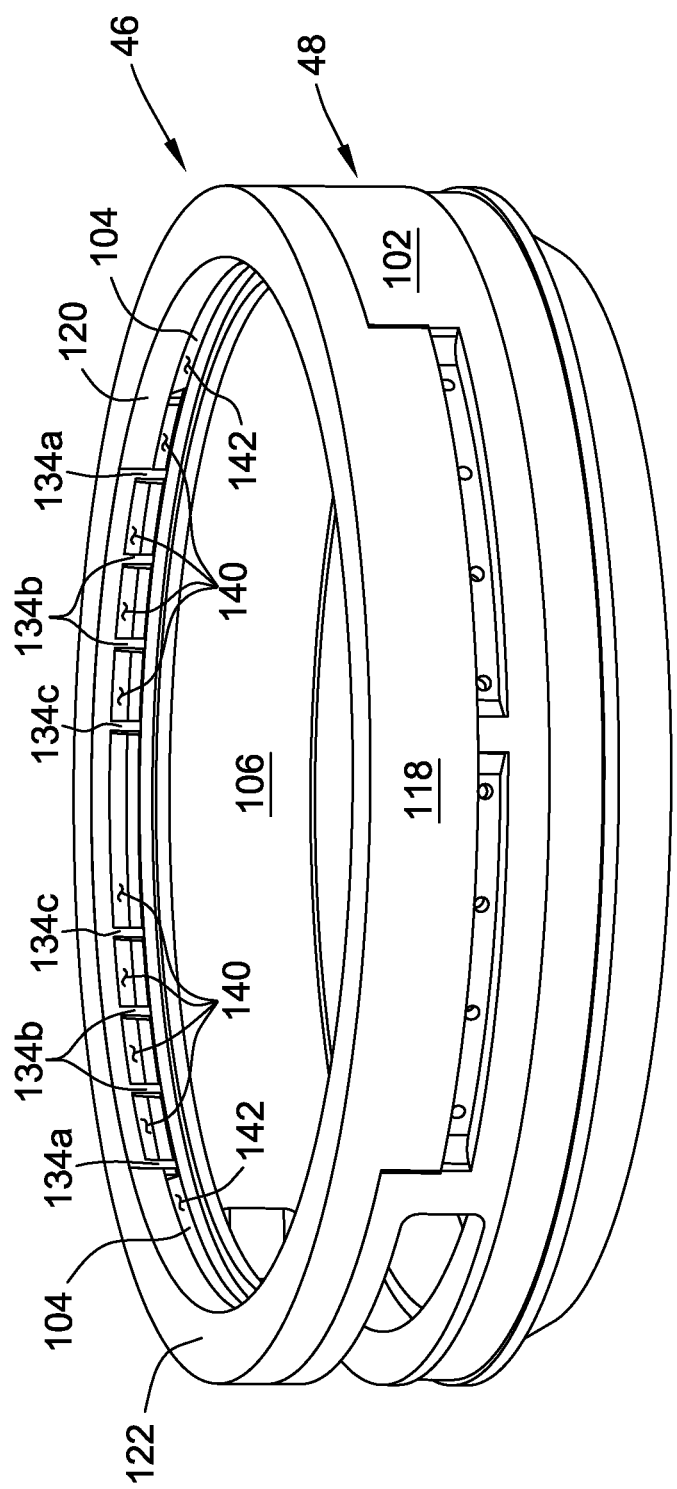
FIG. 8 is another perspective of the assembled liner assembly of FIG. 4.
Figure 9:
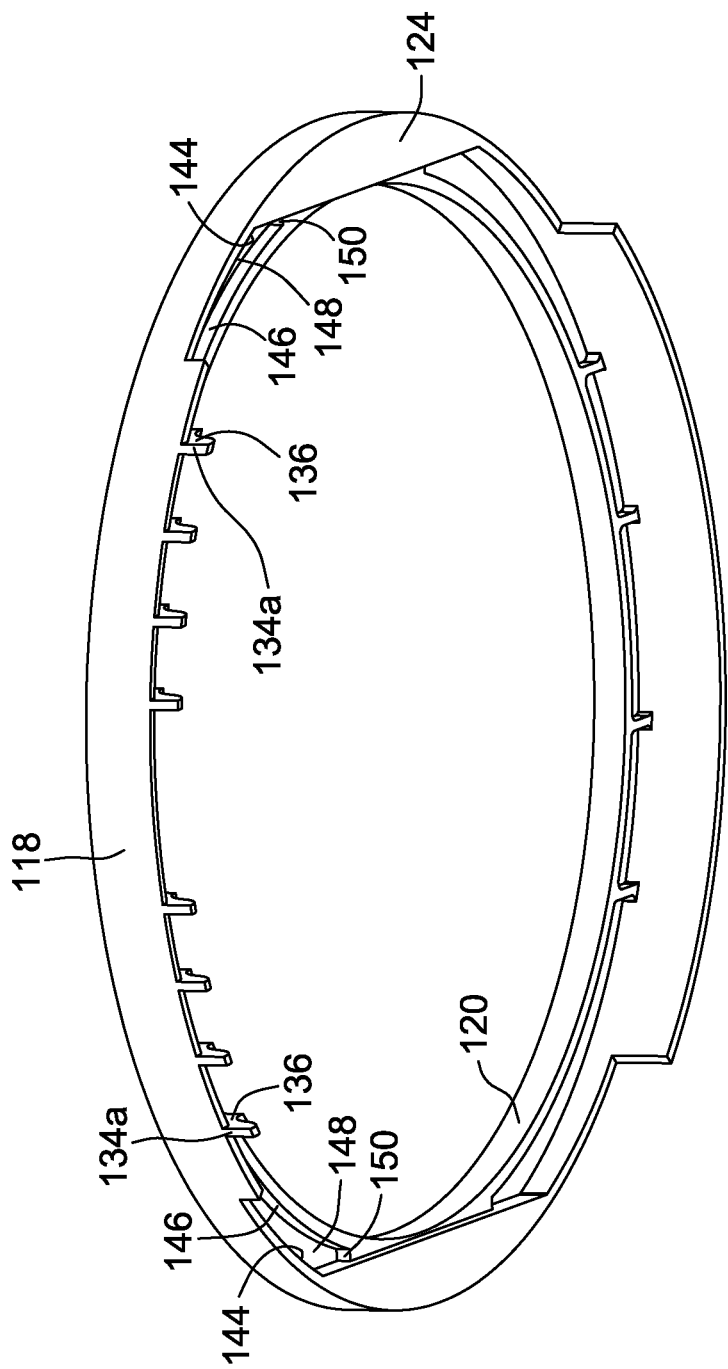
FIG. 9 is another perspective of the upper liner of FIG. 4.

Referring now to FIG. 8, the upper and lower liners 46, 48 also define peripheral channels 142 when positioned within the processing chamber 12. The peripheral channels 142 guide gas 20 to the outer edges of the substrate 14, thereby ensuring a relatively uniform film thickness across the entire substrate surface 28. The peripheral channels 142 are located adjacent to the outer partition walls 134a, and extend circumferentially around the upper and lower liners 46, 48. As shown in FIGS. 6 and 8-9, each peripheral channel 142 is defined by the upper surface 104 of the lower liner 48, one of the sides 136 of a respective outer partition wall 134a, an inner surface 144 of the outer rim 118, an outer surface 146 of the inner rim 120, the lower surface 148 of the top 122 of the upper liner 46, and a lateral sidewall 150 extending between the inner rim 120 and the outer rim 118.

In operation, incoming gas 20 flowing through the outermost channels 140 will be directed upwards and into the peripheral channels 142 by the lower fluid guide 112. The inner surface 144 of the outer rim 118 and the outer surface 146 of the inner rim 120 will guide the gas 20 towards the lateral sidewall 150. As the gas 20 fills the peripheral channels 142, the gas 20 will flow out of the peripheral channels 142 and around the edges of the substrate 14 in the processing volume 22. By directing gas flow to the outer edges of the substrate 14, the upper and lower liners 46, 48 contribute to a more uniform flow rate across the substrate surface 28, and thus a more uniform film thickness of the deposited film.

Figure 10:
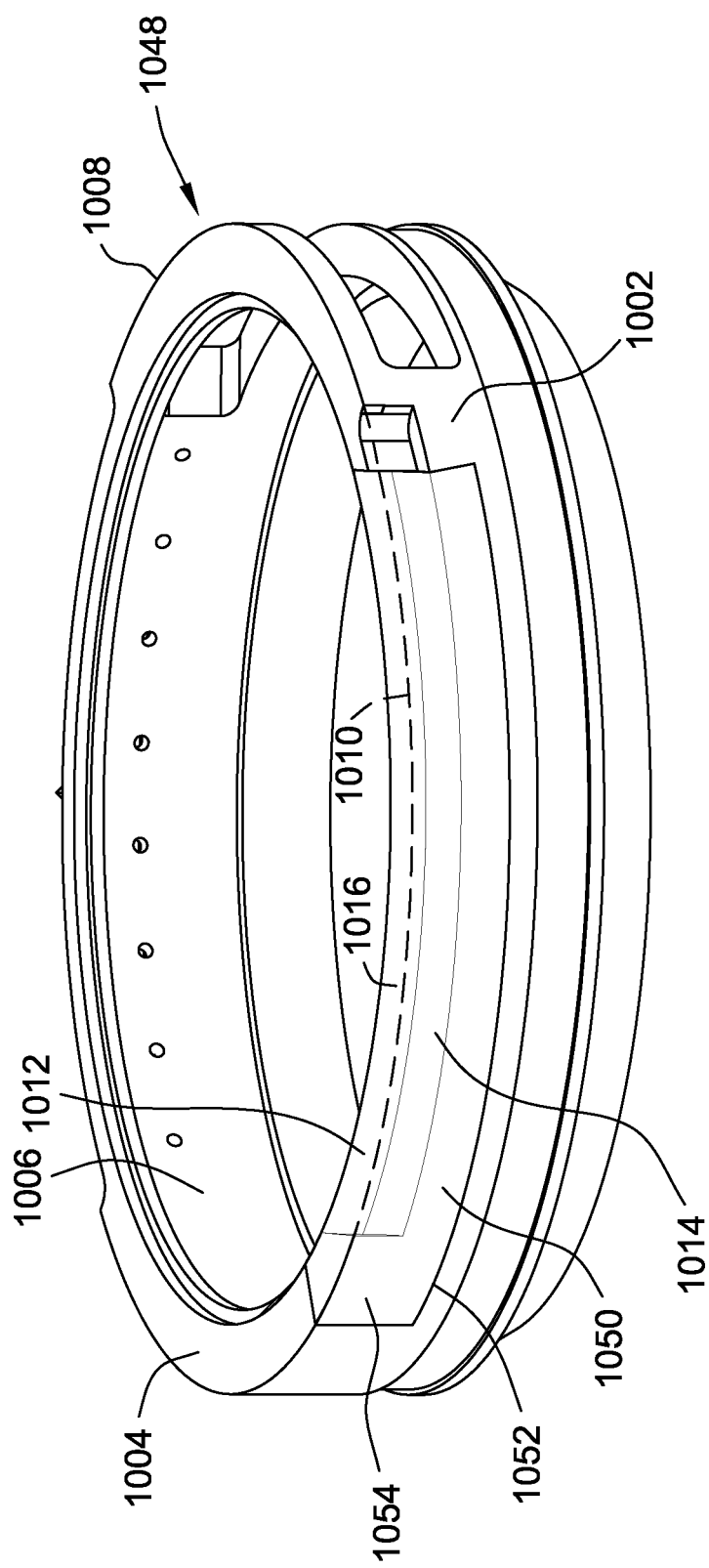
FIG. 10 is a perspective of another embodiment of a lower liner that may be used in the liner assembly of FIG. 4.

FIG. 10 shows an alternative embodiment of a lower liner 1048 comprising a modular assembly. A fluid guide 1012 substantially identical to fluid guide 112 is included in a lower liner insert 1050 that fits within a recess 1052 defined within the annular body of the lower liner 1048. The lower liner insert 1050 includes a bow-shaped body and is sized to be received within the recess 1052. The lower liner insert 1050 includes an outer peripheral surface 1054 that includes the curved fluid guide 1012. With the exception of the lower liner insert 1050, the lower liner 1048 of this embodiment is identical to the lower liner 1048 of FIGS. 4-5 and 7-8. The lower liner 1048 includes an outer peripheral surface 1002, an upper surface 1004, and an inner peripheral surface 1006. The upper surface 1004 includes an outer peripheral edge 1008 that extends around a portion of the outer peripheral surface 1002, and defines an imaginary outer peripheral line 1010 as shown in FIG. 10. The fluid guide 1012 includes a first portion 1014 and a second portion 1016. The first portion 1014 is concave about the imaginary outer peripheral line 1010 of the lower liner 1048, and the second portion 1016 is convex about the imaginary outer peripheral line 1010.

The embodiments described herein are generally suitable for processing semiconductor or solar-grade wafers, though may be used in other applications. The embodiments described herein are particularly suitable for use in atmospheric-pressure silicon on silicon chemical vapor deposition epitaxy using gas mixtures including hydrogen, tricholorosilane, and diborane. Silicon precursors other than tricholorosilane may also be used with the embodiments described herein, including dichlorosilane, silane, trisilane, and tetrachlorosilane. Dopant gas species other than diborane may be used, including phosphene and arsine. The embodiments described herein may also be used in processes other than atmospheric-pressure silicon on silicon epitaxy, including reduced-pressure epitaxy, silicon-germanium epitaxy, carbon-doped silicon epitaxy, and non-epitaxial chemical vapor deposition.

As described above, liner assemblies of the present disclosure provide an improvement over known liner assemblies. The liner assembly avoids problems associated with stepped or linearly sloped liner systems, namely disruption of the incoming gas flow rate and "dead spots" on the substrate surface. These problems are avoided by providing curved upper and lower fluid guiding channels.

Additionally, the liner assembly includes peripheral channels that guide incoming gas to the outer edges of the substrate, thereby providing a more uniform gas flow rate over the substrate surface.

When introducing elements of the present invention or the embodiment(s) thereof, the articles "a", "an", "the" and "said" are intended to mean that there are one or more of the elements. The terms "comprising", "including" and "having" are intended to be inclusive and mean that there may be additional elements other than the listed elements.

As various changes could be made in the above constructions and methods without departing from the scope of the invention, it is intended that all matter contained in the above description and shown in the accompanying drawings shall be interpreted as illustrative and not in a limiting sense.

What is claimed is:

1. A liner assembly for a substrate processing system, the liner assembly comprising:
    a first liner including an annular body and an outer peripheral surface including a first fluid guide, the first fluid guide including a first surface rounded about a circumferential line extending around the first liner; and
    a second liner including an annular body, an outer rim, an inner rim, a second fluid guide extending between the outer rim and the inner rim, and a plurality of partition walls extending outwardly from the second fluid guide, the second fluid guide including a second surface rounded about the circumferential line when the first and second liners are positioned within the processing system, wherein the second surface is opposite the first surface such that a rounded fluid guiding channel is defined between the first surface and the second surface, wherein the first fluid guide is a continuously rounded surface, wherein the second liner includes between three partition walls and twenty-two partition walls.

2. A liner assembly as set forth in claim 1 wherein the first liner is configured to be received in a lower portion of the processing system, and the second liner is configured to be at least partially received in an upper portion of the processing system.

3. A liner assembly as set forth in claim 1 wherein the second fluid guide has a shape complementary to the first fluid guide.

4. A liner assembly as set forth in claim 1 wherein a first portion of the first fluid guide is concave and a second portion of the first fluid guide is convex.

5. A liner assembly as set forth in claim 4 wherein a first portion of the second fluid guide is concave and a second portion of the second fluid guide is convex.

6. A liner assembly as set forth in claim 5 wherein the annular body of the first liner includes an outer peripheral surface and an inner peripheral surface, the first fluid guide extends from the outer peripheral surface to the inner peripheral surface, the first portion and the second portion of the first fluid guide define the continuously rounded surface across an entire length of the first fluid guide, the annular body of the second liner includes an outer peripheral surface and an inner peripheral surface, the second fluid guide extends from the outer peripheral surface to the inner peripheral surface, the first portion and the second portion of the second fluid guide define a continuously rounded surface across an entire length of the second fluid guide.

7. A liner assembly as set forth in claim 1 wherein each partition wall includes a lower surface having a shape complementary to the first fluid guide.

8. A liner assembly as set forth in claim 1 in combination with a chemical vapor deposition system.

9. A liner assembly as set forth in claim 1 further comprising a peripheral channel at least partially defined by an upper surface of the first liner, an inner surface of the outer rim, an outer surface of the inner rim, a lower surface of the second liner, and a sidewall extending between the inner rim and the outer rim.

10. A liner assembly as set forth in claim 1 wherein the first fluid guide is disposed on a removable insert configured to be received within a recess defined within the body of the first liner.

11. A liner assembly as set forth in claim 1 wherein the second fluid guide includes a continuously rounded surface.

12. A liner assembly as set forth in claim 1 wherein the annular body of the first liner includes an outer peripheral surface and an inner peripheral surface, the first fluid guide extends from the outer peripheral surface to the inner peripheral surface and the continuously rounded surface extends between the outer peripheral surface and the inner peripheral surface, the annular body of the second liner includes an outer peripheral surface and an inner peripheral surface, the second fluid guide extends from the outer peripheral surface to the inner peripheral surface and is a continuously rounded surface extending between the outer peripheral surface and the inner peripheral surface.

13. A liner assembly as set forth in claim 1 wherein the second liner includes twenty-two partition walls.

14. A liner assembly as set forth in claim 1 wherein the second liner includes eight partition walls.

15. A liner assembly as set forth in claim 14 wherein the second liner includes two outer partition walls, four inner partition walls, and two central partition walls.

16. A liner assembly as set forth in claim 15 wherein the outer partition walls, the inner partition walls, and the central partition walls are evenly spaced such that a distance between adjacent partition walls is the same for each pair of adjacent partition walls.

17. A liner assembly as set forth in claim 16 wherein an outer partition wall of the two outer partition walls is spaced apart from an inner partition wall of the four inner partition walls a first distance, the central partition walls are spaced apart from each other a second distance greater than the first distance.

18. A liner assembly as set forth in claim 1 wherein each partition wall extends from the second fluid guide a predetermined distance such that a lower surface of each partition wall is substantially flush with a surface of the first fluid guide.

19. A liner assembly as set forth in claim 18 wherein a plurality of channels are defined by the first fluid guide, the second fluid guide, and the plurality of partition walls.

20. A liner assembly for a substrate processing system, the liner assembly comprising:

a first liner including an annular body including a first fluid guide including a first surface having a concave portion having a radius of curvature and a convex portion having a radius of curvature, the annular body includes an outer peripheral surface and an inner peripheral surface, the first fluid guide extends from the outer peripheral surface to the inner peripheral surface; and a second liner including a second fluid guide including a second surface having a concave portion and a convex portion, the first and second liners configured to engage one another such that the first and second fluid guides form at least one fluid guiding channel between the first surface and the second surface, wherein the first fluid guide is a continuously rounded surface extending between the outer peripheral surface and the inner peripheral surface.

21. A liner assembly as set forth in claim 20 wherein the second fluid guide has a shape complementary to the first fluid guide.

22. A chemical vapor deposition system as set forth in claim 21 further comprising a peripheral channel in fluid communication with the processing volume, the peripheral channel at least partially defined by an upper surface of the first liner, an inner surface of the outer rim, an outer surface of the inner rim, a lower surface of the second liner, and a sidewall extending between the inner rim and the outer rim.

23. A liner assembly as set forth in claim 20 wherein the concave portion of the first fluid guide has a radius of curvature between 5 millimeters and 27 millimeters, and the convex portion of the first fluid guide has a radius of curvature between 5 millimeters and 27 millimeters.

24. A liner assembly as set forth in claim 20 wherein the concave and convex portions of the first fluid guide adjoin one another.

\* \* \* \* \*